United States Patent [19]

Smith

[11] Patent Number: 4,644,487
[45] Date of Patent: Feb. 17, 1987

[54] METHOD AND APPARATUS FOR VERIFYING THE DESIGN OF DIGITAL ELECTRONIC COMPONENTS

[75] Inventor: Edward Smith, Wilmslow, England

[73] Assignee: International Computers Limited, London, England

[21] Appl. No.: 592,029

[22] Filed: Mar. 22, 1984

[30] Foreign Application Priority Data

Apr. 9, 1983 [GB] United Kingdom ............... 8309692

[51] Int. Cl.⁴ ...................... G06F 15/20; G06F 11/00; G06G 7/48
[52] U.S. Cl. ..................................... 364/578; 371/23; 364/488
[58] Field of Search ............... 364/488, 578, 200, 900; 371/23, 15, 25

[56] References Cited

U.S. PATENT DOCUMENTS

| | | | |
|---|---|---|---|
| 3,673,397 | 6/1972 | Schaefer | 371/25 |
| 3,932,843 | 1/1976 | Trelut et al. | 371/23 X |
| 4,342,093 | 7/1982 | Miyoski | 364/578 |
| 4,370,728 | 1/1983 | Coffron | 364/900 |
| 4,433,414 | 2/1984 | Carey | 371/25 X |
| 4,455,654 | 6/1984 | Bhaskar et al. | 324/73 R X |
| 4,456,994 | 6/1984 | Segarra | 364/200 X |
| 4,527,249 | 7/1985 | Van Brunt | 371/23 X |
| 4,590,581 | 5/1986 | Widdoes, Jr. | 364/578 |

Primary Examiner—Felix D. Gruber
Assistant Examiner—Edward R. Cosimano
Attorney, Agent, or Firm—Lee, Smith & Zickert

[57] ABSTRACT

A method for verifying the design of a digital electronic component in which the component is replaced by a simulation unit connected to the intended host system. The simulation unit has a memory for holding responses to stimuli from the host system. If the required response is not in the memory, it is calculated and placed in the memory, and the operation of the host system is then re-started from the beginning. In this way, the required set of responses is built up incrementally in the memory until, eventually, the operation of the host system can run to completion.

6 Claims, 2 Drawing Figures

METHOD AND APPARATUS FOR VERIFYING THE DESIGN OF DIGITAL ELECTRONIC COMPONENTS

This invention relates to a method of verifying the design of a digital electronic component and also to simulation apparatus suitable for use in such a method.

One method of verifying the design of a digital electronic component is to build a hardware model of the component and then to test it in situ in the intended host system. The hardware may then be modified to make the appropriate corrections as indicated by the results of the tests. However, this approach has certain disadvantages when used for verifying the design of large or very large scale integrated circuit components.

An alternative approach is to use a software modelling technique to simulate the system. This can be extremely time consuming, since it requires the provision of a software model of the host system as well as of the new component.

In view of these problems, it is proposed to use a mixed hardware/software approach to verification: the new component is simulated using a software model while the host system is implemented using real hardware.

A problem with this mixed hardware software approach is that the response time of the software model is usually slower than that of the real hardware, and this may prevent the system from operating correctly. For example, the real hardware may include a microprocessor which requires responses at set times which cannot be met directly by software simulation. In some cases it may be possible to overcome this problem by instructing the micro- processor to wait until the simulator has calculated the required response. However, not all microprocessors have this facility. Moreover, the system may have some over- riding timing requirements which cannot be handled in this way. The object of the invention is to overcome this problem.

According to the invention, there is provided a method for verifying the design of a digital electronic component comprising the steps:
(a) operating a host system to perform a predetermined sequence of operations in which it produces stimuli for the component and is required to receive responses from the component,
(b) detecting stimuli from the host system and, for each detected stimulus, examining a memory to determine whether it holds a response to that stimulus,
(c) if a response to the stimulus is held in the memory, returning that response to the host system directly from the memory, and
(d) if a response to the stimulus is not held in the memory, calculating the required response and storing it in the memory, and then restarting the operation of the host system from a predetermined starting point.

It can be seen that, during successive runs of the system, a set of required responses is gradually built up in the memory, allowing the operation of the system to proceed further each time. Eventualy, enough responses will have been accumulated in the memory to allow the operation to be completed.

The responses may be stored in the memory sequentially, in chronological order. Alternatively, the responses may be stored in locations of the memory addressed directly or indirectly by the input stimuli.

BRIEF DESCRIPTION OF THE DRAWING

One embodiment of the invention will now be described by way of example with reference to the accompanying drawings.

DESCRIPTION OF AN EMBODIMENT OF THE INVENTION

It is assumed that it is desired to verify the design of a special custom-designed VLSI component, intended for use in a specific digital system, referred to as the host system.

Figure 1:
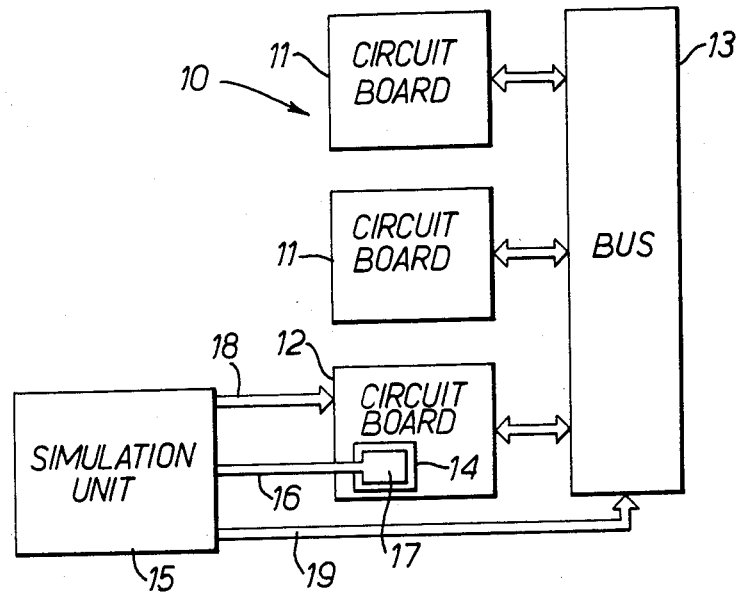
FIG. 1 is a block diagram of an electronic digital system in which one component is simulated.

Referring to FIG. 1, this shows the host system 10, which comprises a plurality of circuit boards 11,12 interconnected by a system highway (bus) 13. Each board 11,12 may carry a microprocessor chip (not shown) and has an internal highway. The construction of the host system 10 forms no part of the present invention and so will not be described in detail.

The circuit board 12 carries a socket 14 for receiving the VLSI component. For the purposes of design verification, this component is simulated by means of a simulation unit 15, connected to the socket 14 by means of an umbilical cable 16 having a probe head 17 with the same pin configuration as the simulated component. Whenever the host system 10 produces a stimulus for the simulated component, this is picked up by the probe head 17 and passed to the simulation unit 15 over the cable 16. The simulation unit then generates a response, as will be described, and returns it to the host system.

The simulation unit 15 is also connected directly to the internal highway (not shown) within the board 12 by way of a cable 18, and to the main system highway 13 by way of a cable 19. The purpose of these connections will be explained later.

Figure 2:
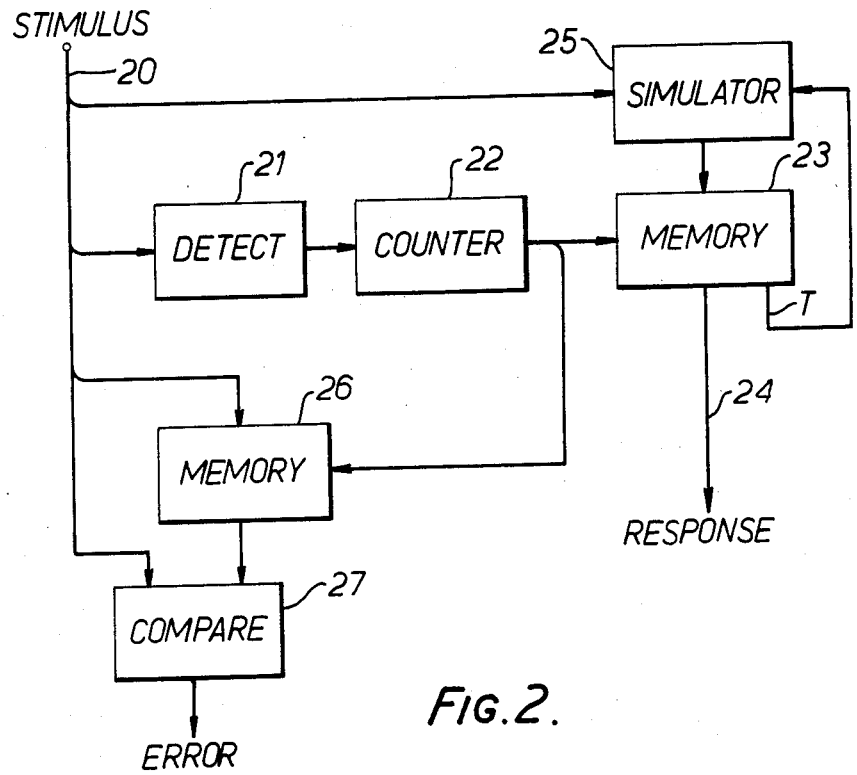
FIG. 2 shows a simulation unit.

Referring now to FIG. 2, this shows the simulation unit 15 in detail. Stimuli received from the host system 10 appear on an input path 20 and are fed to a detector circuit 21. For each detected stimulus, the circuit 21 produces an output pulse which increments a counter 22. The output of the counter addresses a random access memory 23.

Each location in the memory 23 has a tag bit T which indicates whether or not that location contains a valid response to an input stimulus. If the tag bit indicates that the addressed location contains a valid response, the response is read out of the memory 23 and returned to the host system 10 by way of an output path 24.

If, on the other hand, the addressed location does not contain a valid response, the tag bit T triggers a simulator 25. The simulator then takes the input stimulus on path 20 and calculates the required response. This response is loaded into the currently addressed location of the memory 23, and the tag bit T of that location is set to indicate that it now contains a valid response. The counter 22 is then reset to zero, and the operation of the host system is restarted from its initial start point.

Details of the simulator 25 form no part of the present invention. It may, for example, comprise a digital computer, containing a suitable software model of the VLSI component to be simulated. Both the computer and the software model may be standard commercially available items and so they will not be described in detail. For example, one commercially available simulator is the LASAR logic simulation software package supplied by teradyne Inc. However, it should be noted that in the present invention, the software model is used in an unconventional way. In a conventional simulation system, the test data for the software model are loaded into the computer before the simulation commences; in contrast, in the present invention, the test data are provided by the stimuli derived from the real hardware components of the host system, and are generated in real-time.

The simulation unit 15 also contains another random access memory 26 which has the same number of locations as the memory 23 and is also addressed by the output of the counter 22. Whenever a response is calculated and loaded into the memory 23, the stimulus which gave rise to that response is loaded from the path 20 into the corresponding location of the memory 26. Whenever a response is read out of the memory 23, the corresponding stimulus is read out of the memory 26 and is compared, by means of a comparator circuit 27, with the actual stimulus on the path 20. If these two values are not equal, an error must have occurred, and the simulation must be halted.

Operation

Before operation commences, the host system 10 is loaded with a suitable test program for testing out the system and in particular for testing the board 12 and the design of the new VLSI component.

In operation, the simulation unit 15 starts the operation of the system 10 by sending suitable control signals over the cables 18,19. The system then runs the test program, at normal speed, until some input stimulus for the VLSI component is produced, requiring a response. This stimulus is picked up by the probe head 17 and passed to the simulation unit 15. The memory 23 is initially empty, and so the simulator 25 is activated. The simulator then calculates the required response of the VLSI chip to the stimulus, and stores it in the first location of the memory 23.

The simulation unit now causes the execution of the test program to be abandoned, and resets the system to the starting point of the program. If necessary, the test program is reloaded via the cables 18,19.

The test program is then re-started from its starting point. As before, the program will run until it reaches the point at which the stimulus is produced for the VLSI component. This time, however, the appropriate response is immediately available from the memory 23 in the simulation unit. The test program then continues to run at normal speed until it reaches the next point at which a stimulus is produced for the VLSI component, whereupon the above process is repeated.

It can be seen that each time the test program runs, one more response is entered into the memory 23, so that a set of responses is built up incrementally in the memory. Each time the test program runs, it is able to proceed one or more steps further forward than the previous time. Eventually, enough responses are accumulated in the memory to enable the test program (or at least a segment of it) to proceed to completion.

In the above embodiment of the invention, the responses are stored in the memory 23 sequentially, in chronological order.

Alternatively, the responses may be stored in a memory in locations addressed directly or indirectly by the stimuli. This memory acts as a look-up table for the responses. This may be achieved for example by using the input stimulus as a direct address for the memory, or by forming a hash code from the stimulus and using this to address the memory. In this case, it will be appreciated that the memory must have a fast access time, less than the required response time for the VLSI component being simulated. The provision of such a look-up table would be useful, for example, if the system is such that particular stimulus/response combinations are likely to be repeated several times during a run, since it would save simulation time.

The simulation model in the simulator 25 may also include timing information about the responses of the VLSI component. In this case, a timing run may be performed and the timing data for each set of responses calculated and stored. These can then be stored in the memory 23 along with the corresponding responses. The test program can then be re-run, with the simulation unit 15 providing properly timed responses to all the input stimuli to the VLSI component.

What is claimed is:

1. A method for verifying the design of a digital electronic system wherein a first part of the system is physically implemented by real hardware and a second part of the system is simulated by operating a simulator for calculating simulated responses from the second part to the first part of the system, the simulator having a memory connected to it for storing response patterns, wherein the improvement comprises the steps:
    (a) operating the first part of the system to perform a sequence of operations in which the first part of the system produces stimuli for the second part of the system and the first part of the system is required to receive responses from the second part of the system,
    (b) reading out response patterns from said memory and applying them to the first part of the system as responses to said stimuli, and
    (c) when a required response pattern is not present in the memory, storing one of the calculated simulated responses in the memory as a response pattern and than restarting said sequence of operations from a predetermined starting point.

2. Apparatus for verifying the design of a digital electronic system comprising:
    (a) means for physically implementing a first part of the system, and
    (b) simulation means for simulating a second part of the system by calculating responses from the second part to the first part of the system, and
    (c) a memory for holding response patterns, wherein the improvement comprises:
    (d) means for reading out said response patterns from the memory to provide simulated responses from the second part of the system to the first part of the system,
    (e) means operable, when a required response pattern is not present in the memory, for causing the simulation means to calculate the required next response from the second part of the system, and
    (f) means for storing the calculated response in the memory as a response pattern, and then restarting operation of the system from a predetermined starting point.

3. A method for verifying the design of a digital electronic component wherein the component is simulated by calculating simulated responses from the component, wherein the improvement comprises the steps:
    (a) operating a host system to perform a predetermined sequence of operations in which it produces stimulii for the component and is required to receive responses from the component, (b) detecting stimulii from the host system and, for each detected stimulus, examining a memory to determine whether it holds a response to that stimulus, (c) if a response to the stimulus is held in the memory, returning that response to the host system directly from the memory, and (d) if a response to stimulus is not held in the memory, storing one of the calculated simulated responses in the memory, and then restarting the operation of the host system form a predetermined starting point.

4. A method according to claim 3 wherein the responses are stored in the memory sequentially, in chronological order.

5. Apparatus for verifying the design of a digital electronic component, comprising:

(a) a host system arranged to perform a predetermined sequence of operations in which it produces stimulii for the component and is required to receive responses from the component, and (b) simulation means for simulating said component by calculating said responses from the component wherein the improvement comprises:

(c) a memory for holding responses to said stimuli, (d) means for detecting a stimulus from the host system and for determining whether a response to a stimulus is already held in the memory and, if so, returning that response to the host system directly from the memory, (e) means operative in the event that a response to a stimulus is not held in the memory, for operating said simulation means to calculate the required response to the stimulus, and (f) means for storing the calculated response in the memory and then restarting the operation of the host system from a predetermined starting point.

6. Apparatus according to claim 5 including a counter for addressing the memory, means for incrementing the counter each time a stimulus is detected, so that the responses are read out of the memory sequentially, and means for resetting the counter after a response is stored in the memory.

* * * * *